United States Patent [19]

Dias

[11] Patent Number: 4,850,000

[45] Date of Patent: Jul. 18, 1989

[54] GATED SHIFT REGISTER

[75] Inventor: Donald R. Dias, Carrollton, Tex.

[73] Assignee: Dallas Semiconductor Corporation, Dallas, Tex.

[21] Appl. No.: 117,685

[22] Filed: Nov. 5, 1987

[51] Int. Cl.$^4$ .................. G11C 19/00; G11C 29/00; H03K 21/40

[52] U.S. Cl. .................. 377/54; 377/77; 377/75; 377/32; 365/219

[58] Field of Search .................. 377/30, 31, 32, 54, 377/77, 81; 365/219

[56] References Cited

U.S. PATENT DOCUMENTS

| | | | |
|---|---|---|---|
| 3,845,282 | 10/1974 | Mattson | 377/39 |
| 3,916,323 | 10/1975 | Moriyama et al. | 377/30 |
| 4,085,311 | 4/1978 | Ohsako et al. | 377/32 |
| 4,697,279 | 9/1987 | Baratti et al. | 377/77 |

OTHER PUBLICATIONS

Data Sheet, which appeared in the 1985-86 Data Book of Dallas Semiconductor Corporation, for the DS1223 part.

Primary Examiner—John S. Heyman
Attorney, Agent, or Firm—Worsham, Forsythe, Sampels & Wooldridge

[57] ABSTRACT

A gated shift register includes a first set of 16 storage devices and a second set of 16 storage devices with interconnection circuitry for configuring the first set of 16 storage devices as a 16 bit shift register. The second set of storage devices is coupled between the outputs of the first set of storage devices and 16 output terminals of the gated shift register and transfers the outputs from the first storage devices to the output terminals when a transfer input terminal is at a first logic state, and isolates the first storage devices from the output terminals and retains the data at the output terminals when the transfer input signal switches to a second logic state. The gated shift register also includes power monitor and control circuitry for supplying standby battery voltage to the circuit when the primary power source becomes unavailable.

10 Claims, 2 Drawing Sheets

GATED SHIFT REGISTER

TECHNICAL FIELD

This invention relates to electronic storage devices, and more particularly to gated shift registers.

BACKGROUND OF THE INVENTION

Electronic circuit assemblies, for example printed circuit board products such as add-on boards for computer systems, often must be designed for use in different environments which require different configurations of the board products. Typically the manufacturer, rather than customizing each board at the factory, provides a method to allow the end-user to customize the system for his specific environment. In the past, this customization has generally been with mechanical dip switches or jumper wires.

However, a major problem with the use of this type of customization is that it often must be made by non technically inclined users. The user is often required to study technical material about the board and about the computer system and to move the dip switches or the jumper wires which are sometimes difficult to find and/or access. As a result, the end-user often becomes frustrated and tends to rely heavily on telephone support from the manufacturer. Thus, the manufacturer of the board product is required to provide telephone support at a relatively high cost to the manufacturer.

Therefore, it can be appreciated that a device which would allow customization of printed circuit boards to an end-user configuration which is easy and simple to use by the end-user is highly desirable.

SUMMARY OF THE INVENTION

It is, therefore, an object of this invention to provide a device to allow customization of electronic circuitry by an end-user which is relatively simple and easy to use.

It is also an object of this invention to provide a shift register which will allow data to be loaded and then recycled for confirmation before such data is placed on output terminals as parallel data.

Shown in an illustrated embodiment of the invention is a gated shift register which receives a serial data stream at an input terminal and converts this serial data stream to a plurality of output signals appearing simultaneously at a plurality of output terminals. This shift register has a first set of N storage devices and includes circuitry for coupling the input terminal to the input of the first storage device and for coupling the outputs of the first N-1 storage devices to the inputs of the last N-1 storage devices to form a shift register of N bits in length. The shift register also includes a second set of N storage devices, the outputs of which are coupled to the output terminals. Additional circuitry is included for transferring the data stored in the first set of storage devices to the second of storage devices if a first logic state is applied to a transfer input terminal and for isolating the data stored in the first storage devices from the second storage devices if a second logic state is applied to the transfer input terminal.

BRIEF DESCRIPTION OF THE DRAWINGS

The aforementioned and other features, characteristics, advantages, and the invention in general, will be better understood from the following, more detailed description taken in conjunction with accompanying drawings in which.

It will be understood that for clarity and where deemed appropriate, reference numbers have been repeated in the figures to show corresponding features.

DESCRIPTION OF THE PREFERRED EMBODIMENT

Figure 1:
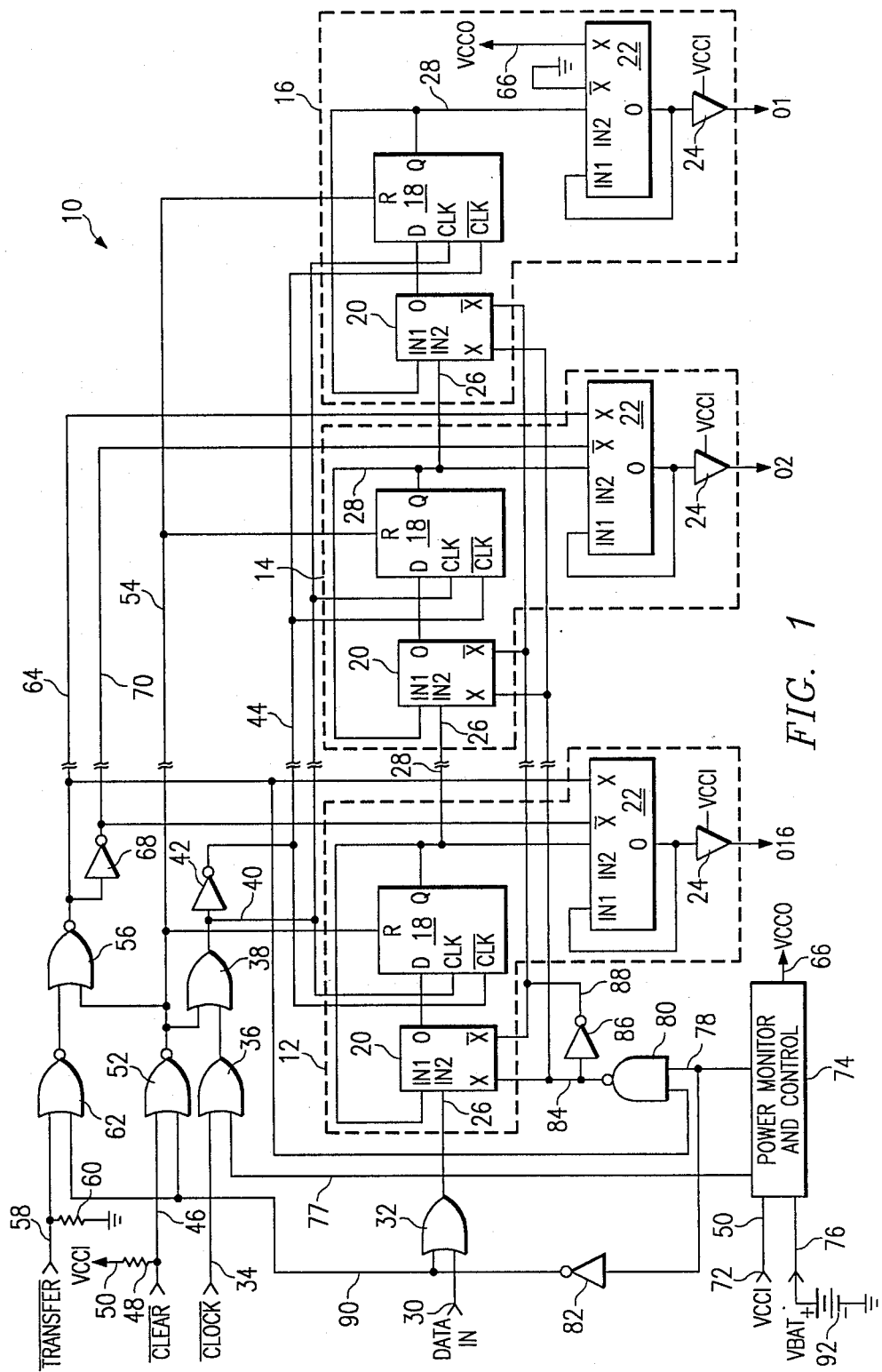
FIG. 1 is a logic diagram of a gated shift register according to the present invention.

Turning now to the drawings, FIG. 1 shows a gated shift register 10 which includes sixteen data storage blocks in the preferred embodiment, three of which are shown in FIG. 1 and are contained within the dashed outline areas 12, 14, and 16. Each of the data storage blocks contains a D latch 18, an input MUX circuit 20, an output transfer latch 22, and an output driver circuit 24. Within each of the data storage blocks an output 0 of the MUX circuit 20 is connected to an input D of the D latch 18, and the Q output of the D latch 18 is connected to a first input IN1 of the MUX circuit 20 and to an input IN2 of the transfer latch 22. An output 0 of the transfer latch 22 is connected to another input IN1 of he transfer latch 22. The output 0 of the transfer latch 22 is also connected to the input of the driver circuit 24, the output of which is connected to one of the 16 output lines, 01-016, of the gated shift register 10. Each of the data storage blocks receives an input on a line 26 which is connected to an IN2 input of the MUX 20, and has an output on a line 28 which is connected to the Q output of the D latch 18. The output on the line 28 of the data storage block 12 is connected to the IN2 input of another data storage block not shown in FIG. 1, and the outputs on the line 28 of each of the data storage blocks, except the data storage block 16, is connected to the input on the line 26 of the next data storage block to thereby form a series connection of 16 data storage blocks.

A DATA IN input terminal 30 is connected an input of an OR gate 32, the output of which is connected to the input on the line 26 of the data storage block 12. A CLOCK input terminal 34 is connected to an input of an OR gate 36, the output of which is connected to an input of another OR gate 38. The output of the OR gate 38 on a line 40 is connected to a CLK input of each of the D latches 18 and to the input of an inverter 42. The output of the inverter 42 on a line 44 is connected to a $\overline{\text{CLK}}$ input of each of the D latches 18. A $\overline{\text{CLEAR}}$ input terminal 46 is connected to one end of a resistor 48, the other end of which is connected to a VCCI voltage on a node 50. The $\overline{\text{CLEAR}}$ input terminal 46 is also connected to one input of a NOR gate 52, the output of which on a line 54 is connected to an R input of each of the D latches 18, to a second input of the OR gate 38, and to an input of another NOR gate 56. A $\overline{\text{TRANSFER}}$ input terminal 58 is connected to one end of a resistor 60, the other end of which is connected to ground. The $\overline{\text{TRANSFER}}$ input terminal 58 is also connected to one input of a NOR gate 62, the output of which is connected to a second input of the NOR gate 56. The output of the NOR gate 56 on a line 64 is connected to a first input of a NAND gate 80 and to an X input of each of the transfer latches 22 except for the X input of the transfer latch 22 of the data storage block 16 which is connected to a VCCO voltage on a node 66. The output of the NOR gate 56 is also connected to an inverter 68, the output of which on a line 70 is connected to an $\overline{X}$ input of each of the transfer latches 22 except for the $\overline{X}$ input of the transfer latch 22 of the data storage block 16 which is connected to ground.

A VCCI input terminal 72 is connected to the node 50 and is also connected as an input to a power monitor and control circuit 74. A VBAT input terminal 76 is connected to a second input of the power monitor and control circuit 74. The power monitor and control circuit 74 produces the VCCO voltage at the node 66 which is used to provide power to the logic circuits inside the gated shift register 10 with the exception of the output driver circuits 24 which are powered by the VCCI voltage on node 50. A second output of the power monitor and control circuit 74 on a line 77 is connected to a second input of the OR gate 36. A third output of the power monitor and control circuit 74 on a line 78 is connected to a second input of the NAND gate 80 and to the input of an inverter 82. The output of the NAND gate 80 on a line 84 is connected to an X input of each of the MUX circuits 20 and also to the input of another inverter 86. The output of the inverter 86 on a line 88 is connected to an $\overline{X}$ input of each of the MUX circuits 20. The output of the inverter 82 on a line 90 is connected to a second input of the OR gate 32, to a second input of the NOR gate 52, and to a second input of the NOR gate 62.

In an alternate form of the preferred embodiment, the gated shift register 10 includes eight data storage blocks and eight output lines 01-08 rather than the sixteen data storage blocks and sixteen output lines described above. The structure of the eight data storage block embodiment is the same as the structure of the sixteen data storage block embodiment except that eight of the internal data storage blocks are not present in the eight data storage block embodiment. The data storage blocks 12, 14 and 16 are also present in the eight data storage block embodiment with the 08, 02, and 01 output terminals connected to the data storage blocks 12, 14, and 16 respectively.

The gated shift register 10, in the preferred embodiment, is fabricated on a single integrated circuit, and is designed to operate with a nominal VCCI voltage of +5.0 volts and with a battery voltage of +2.25 volts from a lithium battery 92 which is external to the gated shift register 10 and which is coupled to the VBAT input terminal 76. However, in one application the gated shift register 10 and the lithium battery 92 are contained inside the same dual-in-line integrated circuit package.

DATA ENTRY OPERATION

During normal data entry operations, when the voltage at the VCCI input terminal 72 is at +5.0 volts in the preferred embodiment, the output on the line 77 of the power monitor and control circuit 74 will be at a logic 0 level and the output on the line 78 will be at a logic 1 level. Also, the signal at the $\overline{CLEAR}$ input terminal 46 will be a logic 1 level as will be the signal at the $\overline{TRANSFER}$ input terminal 58. Under these conditions, the line 64 will be at a logic 1 level and the line 70 will be a logic 0 level. Thus, the X inputs on the transfer latches 22 of the data storage blocks 12 and 14 and the other data storage blocks not shown in FIG. 1 will be at a logic 1 level while the $\overline{X}$ inputs of these transfer latches 22 will be at a logic 0 level which will cause the transfer latches 22 to couple the signal present at their IN1 inputs to their O outputs. Since the 0 outputs are connected back to the IN1 inputs, these transfer latches will store the data at the O outputs present when the signal on the line 64 went to the logic 1 level and the signal on the line 70 went to the logic 0 level. Thus, the Q outputs of the D latches 18 are isolated from the output terminals 02-016. In contradistinction, the Q output of the D latch 18 of the data storage block 16 is always coupled to the 01 output of the shift register 10 since the transfer latch 22 in this data storage block 16 has its X input connected to the VCCO node 66 and its $\overline{X}$ input connected to ground.

During this data entry operation, the second input of the OR gate 32 and the second inputs of the NOR gates 52 and 62 are at a logic 0 level which causes these respective NOR gates to act as inverters. The output of the NOR gate 52 is a logic 0 level which causes the NOR gate 56 to act as an inverter and the OR gate 38 to pass the signal on its other input terminal to its output terminal on the line 40. Also, the inputs to the NAND gate 80 are both at a logic 1 level which places a logic 0 level on the line 84 and a logic 1 level on the line 88. Under these conditions, the MUX circuits 20 will couple the input present at their IN2 inputs to their 0 outputs and thus to the D inputs of the D latches 18.

The voltage present at the DATA IN input terminal 30 will be transferred to the Q output of the D latch 18 of the data storage block 12 upon the rising edge of the clock signal at the CLOCK input terminal 34. Similarly, in each of the data storage blocks such as 14 and 16 the logic level present at the input lines 26 will be transferred to the output lines 28 when the signal at the CLOCK input terminal rises to a logic 1 level. The Q outputs of the D latches 18 will remain at this logic level until the next rising edge of the signal at the CLOCK input terminal 34 or until a clear signal is received at the $\overline{CLEAR}$ input terminal 46. Thus, the data blocks 12, 14, and 16 and the other data blocks not shown in FIG. 1 operate as a shift register shifting the signal present at the DATA IN input terminal 30 to successive data storage blocks with each rising edge of the signal on the CLOCK input terminal 34.

DATA TRANSFER OPERATION

Significantly, however, the data appearing at the output lines 28 of the data storage blocks is not transferred to the output lines 02-016 while the transfer signal at the $\overline{TRANSFER}$ input terminal 58 is at a logic 1 level. Rather, the transfer latches 22 will hold the data present at their 0 outputs during the previous data transfer operation. Thus, data can be shifted through the data storage blocks without changing the logic levels at the output terminals 02-016, permitting a predefined bit pattern to be shifted into the data storage registers without disturbing the output signals 02-016 until the proper data has been loaded into the registers. At that time, the signal at the TRANSFER input terminal 58 can be brought to a logic 0 level which will cause the line 64 to go to a logic 0 level and the line 70 to a logic 1 level. Under these conditions, the X and $\overline{X}$ inputs of the transfer latches 22 will be at a logic 0 level and logic 1 level respectively which will cause the logic levels at the IN2 inputs to be transferred to the 0 outputs of the data latch 22 and thus to the output lines 02-016.

Also, when the signal on the line 64 goes to a logic 0 level, the output of the NAND gate 80 becomes a logic 1 level and the output of the inverter 86 becomes a logic 0 level. Accordingly, the X inputs to the MUX circuits 20 are at a logic 0 level and the $\overline{X}$ inputs are at a logic 1 level, thereby causing the MUX circuits 20 to couple the signals at their IN1 inputs to their 0 outputs. Since the IN1 inputs are connected to the Q outputs of their respective D latch 18, each of the data storage blocks will recycle its own output on its output line 28 as clock signals are received by the gated shift register 10, and data entry operations will thus be inhibited.

There are several advantages to the gated shift register 10 shown in FIG. 1. For example, when the gated shift register 10 of FIG. 1 is used with a printed circuit board product which requires customization, the gated shift register 10 of FIG. 1 can perform this customization by using software generated signals inside the computer. Thus, the gated shift register 10 of FIG. 1 can replace mechanical switches and jumper wires, allowing a user to configure the system either by keyboard inputs, by telephone link, or by preprogramed software which automatically determines the computer system configuration. The gated shift register 10 also has the advantage of providing valid logic levels directly at the 01-016 output terminals rather than through passive resistors.

Since the 01 output always provides the state of the Q output of the D latch 18 of the data block 16, regardless of the signal being applied to the $\overline{TRANSFER}$ input terminal 58, the 01 output can be used to verify that the correct data has been loaded into the gated shift register 10. This verification process is accomplished by first loading the correct data into the gated shift register 10, and then recirculating the data back through the shift register 10 while simultaneously comparing the serial data from the 01 output terminal to the serial data that has been sent to the gated shift register 10. Also, in addition to verification, the present settings for outputs of the output lines 02-016 can be read at any time by placing a logic 1 level at the $\overline{TRANSFER}$ input terminal 58 and then recycling the data through the gated shift register 10 while monitoring the output of the 01 output terminal.

Moreover, any number of gated shift registers can be cascaded together by connecting the 01 output of one gated shift register 10 to the DATA IN input terminal of another gated shift register 10.

The pulldown resistor 60 is used to hold the $\overline{TRANSFER}$ input terminal 58 at a known logic state if the external driving circuitry were to become disconnected or fail to drive this input terminal for any other reason.

CLEAR OPERATION

With reference again to FIG. 1, when the input signal at the $\overline{CLEAR}$ input terminal 46 is pulled to a logic 0 level, the output of the NOR gate 52 on the line 54 will switch to a logic 1 level which will place a logic 1 level at the R inputs to the D latches 18. A logic 1 level at the R inputs of the D latches 18 will cause the Q outputs of the D latches 18 to go to a logic 0 level if the CLK input on the line 40 is a logic 1 level and the $\overline{CLK}$ input on the line 44 is a logic 0 level. The logic 1 level on the line 54 also forces the output of the OR gate 38 to a logic 1 level to satisfy these conditions and, therefore, the Q outputs of the D latches 18 will become a logic 0 level. The logic 1 level on the line 54 also causes the output of the NOR gate 56 on the line 64 to go to a logic 0 level and thus the line 70 to go to a logic 1 level which causes the transfer latch circuits 22 to couple the Q outputs of the D latches 18 to the output terminals 02-016. Thus, a logic 0 level at the $\overline{CLEAR}$ input terminal 46 causes the D latches 18 to go to a logic 0 level which is coupled to the output terminals 01-016.

The pullup resistor 48 allows the $\overline{CLEAR}$ input terminal 46 to be connected directly to a mechanical switch.

This clear feature of the gated shift register 10 can therefore be used to erase any previous settings and return to an unconfigured state with a single command or with a push-button switch.

POWER CONTROL

Figure 2:
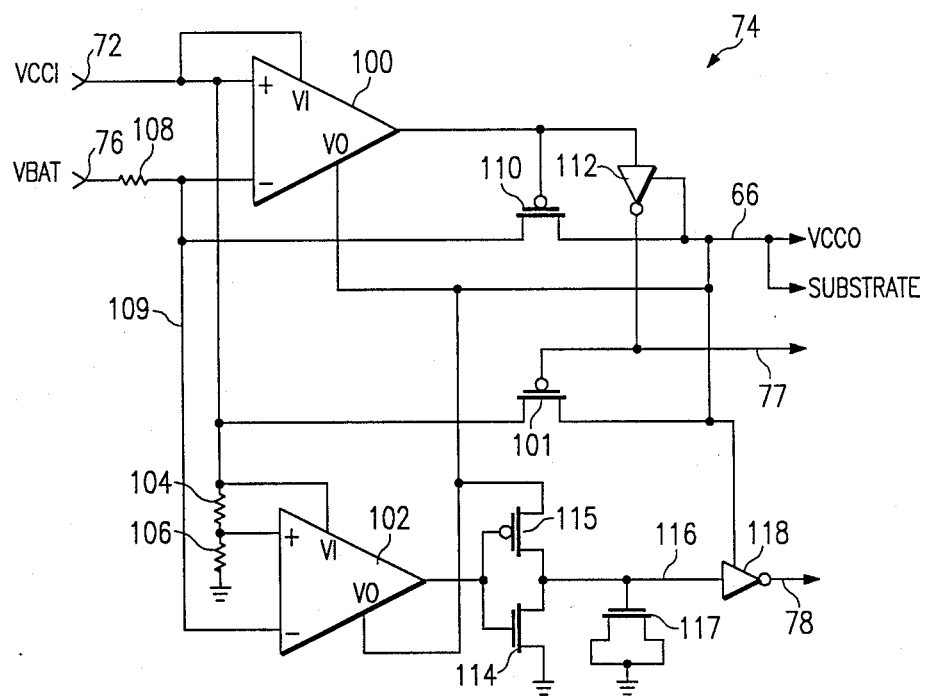
FIG. 2 is a logic diagram of the power monitor and control circuit shown in FIG. 1.

In order for the gated shift register 10 to operate as a replacement for a mechanical dip switch or for jumpers, the data storage blocks must retain their data when the primary power or VCCI voltage is unavailable. Under these conditions, the gated shift register 10 receives power for the logic circuitry using the voltage from the VBAT input terminal 76 which, in the preferred embodiment, is the voltage provided by the lithium battery 92. Turning now to FIG. 2, a circuit diagram is shown of the power monitor and control circuit 74 of FIG. 1. The VCCI input terminal 72 is connected to a positive input of a first comparator 100, to a VI input of the comparator 100, to the source of a p-channel transistor 101, to a VI input of a second comparator 102, and to one end of a resistor 104, the other end of which is connected to a positive input of the comparator 102 and to one end of another resistor 106, the other end of which is connected to ground. The VBAT input terminal 76 is connected to one end of a resistor 108, the other end of which is connected to a node 109, to a negative input of the comparator 100, to the source of another p-channel transistor 110, and to a negative input terminal of the second comparator 102. The resistor 108 is relatively small and is used mainly to satisfy Underwriters Laboratories' requirements for circuits using lithium batteries. Thus, the voltage on the node 109 is virtually the same as the voltage at the VBAT input terminal 76. The output of the comparator 100 is connected to the gate of the p-channel transistor 110 and to the input of an inverter 112. The output of the inverter 112 is connected to the line 77 and also to the gate of the p-channel transistor 101. The drains of the p-channel transistors 101 and 110 are connected together to form the VCCO node 66 which also provides the substrate bias voltage. The node 66 is connected to a VO input of the comparators 100 and 102. The output of the comparator 102 is connected to the gates of two transistors in series: an n-channel transistor 114, the source of which is connected to ground, and the drain of which is connected to a node 116; and a p-channel transistor 115, the drain of which is also connected to the node 116 and the source of which is connected to the VCCO node 66. The node 116 is also connected to the gate of another n-channel transistor 117 which is configured as a capacitor by having its source and drain connected together and to ground. The node 116 is also connected to the input of an inverter 118, the output of which drives the line 78.

As stated previously, the VCCO node 66 provides the voltage to the logic circuits of the gated shift register 10 except for power to the output driver circuits 24. The VCCO voltage on node 66 thus provides power to the inverters 112 and 118 and provides power to the inverter consisting of transistors 114 and 115.

In operation, the comparator 100 compares the voltage at the VCCI input terminal 72 with the voltage on the node 109 and provides a logic 1 level at its output when the voltage at the VCCI input terminal is greater than the voltage on the node 109. This logic 1 level disables or makes nonconductive the p-channel transistor 110, and is inverted by the inverter 112 to enable or make conductive the p-channel transistor 101 to thereby couple the voltage at the VCCI input terminal 72 onto the node 66 to provide power to the logic circuits of the gated shift register 10. The output of the inverter 112 and the line 77 are at a logic 0 level under this condition.

In the preferred embodiment in which the nominal VCCI voltage is +5.0 volts and the VBAT voltage is +2.25 volts, the resistor 106 is equal to the resistor 104 so that if half the voltage at the VCCI input terminal 72 is greater than the voltage on the node 109, then the output of the comparator 102 will be a logic 1 level. With the battery voltage at +2.25 volts, the output of the comparator 102 will be a logic 1 level if the voltage at the VCCI input terminal 72 is greater than +4.5 volts. Therefore, under normal conditions the output of the comparator 102 is a logic 1 level which is inverted by the transistors 114 and 115 to place a logic 0 level on the node 116. This logic 0 level in turn is inverted by the inverter 118 to provide a logic 1 level on the line 78.

Figure 3:
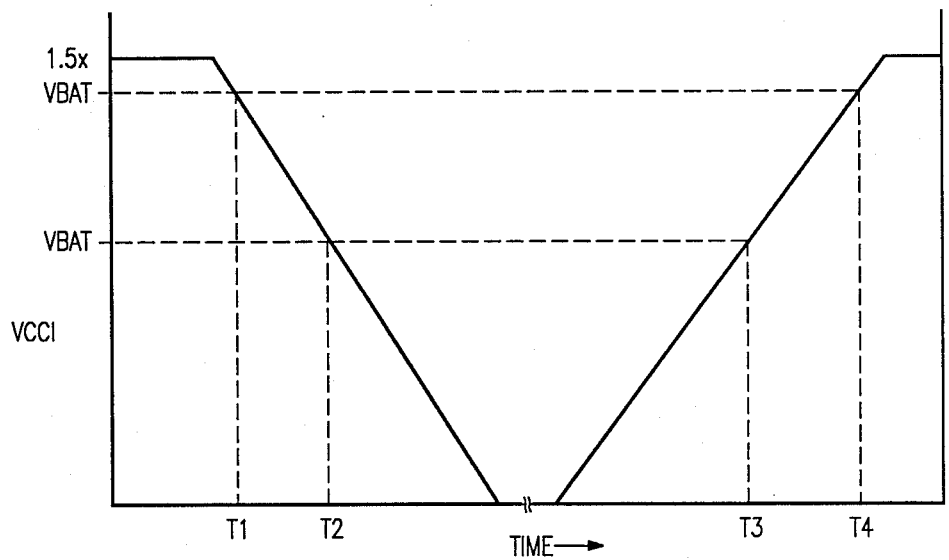
FIG. 3 is a graph of the VCCI voltage as it falls and rises and crosses the comparator input voltage levels used in the power monitor and control circuit shown in FIG. 1.

Turning now to FIG. 3, when the voltage on the VCCI input terminal 72, labeled as VCCI in FIG. 3, begins to fall and becomes less than twice the voltage at the node 109, which event is shown occurring at time T1 in FIG. 3, then the output of the comparator 102 becomes a logic 0 level, and the node 116 is pulled to a logic 1 level by the transistor 115. In the preferred embodiment the transistor 115 is of sufficiently low impedance to rapidly charge the capacitance of the transistor 117. When the voltage on the node 116 crosses the switching threshold of the inverter 118, the line 78 voltage goes to a logic 0 level. With reference now to FIG. 1, when the line 78 goes to a logic 0 level, the line 90 becomes a logic 1 level which causes a logic 1 level to be provided at the output of the OR gate 32 and a logic 0 level at the outputs of the NOR gates 52 and 62 which, in turn, lock out the signals appearing at DATA IN input terminal 30, the $\overline{\text{CLEAR}}$ input terminal 46, and the $\overline{\text{TRANSFER}}$ input terminal 58. Also, when the line 78 voltage goes to a logic 0 level the output of the NAND gate 80 becomes a logic 1 level and the line 88 voltage becomes a logic 0 level. This action causes the MUX circuits 20 to couple the signals from their IN1 inputs to their 0 outputs. Within each of the data storage blocks (for example, the data storage blocks 12, 14, and 16) the Q output from the D latch 18 is fed through the MUX circuit 20 to the D input of the D latch 18. Thus, if the D latches 18 should receive a clock signal under this condition, the clock signal would have no effect on the data stored in the D latches 18 since the same logic levels would be clocked from the D inputs to the Q outputs again. Therefore, the effect of the clock signal would be inconsequential. In summary, at time T1 in FIG. 3 when the VCCI voltage falls below +4.5 volts in the preferred embodiment, the data in signal, the $\overline{\text{clear}}$ signal and the $\overline{\text{transfer}}$ signal are locked out of the gated shift register 10, and the data storage blocks enter a condition in which each recirculates its own data in response to a clock signal rather than transferring data from a previous data storage block or from the DATA IN input terminal 30.

With reference again to FIG. 3, when the VCCI voltage drops further to less than the voltage level on the node 109, then the output of the comparator 100 becomes a logic 0 level, causing the transistor 110 to become conductive and the transistor 101 to become nonconductive. At this point the logic circuits inside the gated shift register 10 which receive their power from node 66 are now powered from the voltage appearing at the VBAT input terminal 76. Also at this time the signal on the line 77 changes from a logic 0 level to a logic 1 level to inhibit the clock input signal at the clock input terminal 34. Thus at the time T2 in FIG. 3, all of the input signals have been locked out of the gated shift register 10, and the internal logic circuits, except for the output driver circuits 24, are powered by the voltage appearing at the VBAT input terminal 76.

As the VCCI voltage rises from zero volts and becomes greater than the battery voltage at time T3, the clock signal on the clock input terminal 34 is enabled in the OR gate 36, and the internal logic circuits of the gated shift register 10 again receive power from the VCCI input terminal 72. At time T3 the data storage blocks are still configured to recycle their own data should a clock signal be applied at the CLOCK input terminal 34.

As the VCCI voltage increases to greater than twice the voltage on the VBAT input terminal 76, at time T4 in FIG. 3, then the output of the comparator 102 switches to a logic 1 level, transistor 114 becomes conductive, and transistor 115 becomes nonconductive. As a result, the voltage on node 116 begins to fall towards ground potential. Advantageously, however, the transistor 114 is not sufficiently conductive to quickly pull the node 116 to ground. Thus, when the VCCI voltage is increasing and passes +4.5 volts in the preferred embodiment, there is a delay before the voltage on the line 78 switches to a logic 1 level to give additional time for the external circuitry driving the gated shift register 10 to settle down in order to avoid passing extraneous clock signals which might appear on the clock input terminal 34. After the node 116 reaches a logic 0 level, the inverter 118 provides a logic 1 level on the line 78 and the gated shift register 10 is in its normal operating condition.

This two step comparator operation, using comparators 100 and 102, avoids a false clock signal from shifting data within the gated shift register 10, and also reduces the power consumed by the gated shift register 10 when operating from the battery voltage. More specifically, when the VCCI voltage falls below +4.5 volts in the preferred embodiment, the data storage blocks are configured to recirculate the data inside each of the data storage blocks; however, the clock input is not inhibited since the inhibit signal would cause a false clock signal to the data storage blocks. However, when the VCCI voltage falls below the battery voltage, then the OR gate 36 is inhibited in order to prevent extraneous signals on the CLOCK input terminal 34 from toggling the OR gate 36.

The comparators 100 and 102 each have a onventional differential amplifier first stage which has transistors operating in their active regions that draw considerably more power than the CMOS logic circuits used in the rest of the gated shift register 10. Therefore this first stage is powered only by the VCCI voltage at the VI input terminal. The output of the first stage is connected to an output stage which is configured as a Schmitt trigger logic gate and which additionally has an input transistor connected between the input terminal of the second stage and ground and which is always conductive, but with a relatively high channel impedance that is easily overcome by the driver transistor of the first stage. This second stage is powered by the VCCO voltage on the node 66. Advantageously, the inputs to the comparator first stage are arranged so that when the VCCI voltage is falling, the output of the first stage goes to a logic 0 level which is the voltage that the first stage produces when the VCCI voltage is at ground potential. The Schmitt trigger operation of the output stage together with the conductive input transistor of the output stage provides noise immunity when the VCCI voltage is near ground should there be spurious noise spikes on the VCCI input terminal 72 which would be coupled into the input stages of the comparators 100 and 102.

As stated previously, the output driver circuits 24 are powered only by the VCCI voltage. The output driver circuits 24 are a series pair of a p-channel transistor and an n-channel transistor connected in the same manner as the transistors 115 and 114 respectively shown in FIG. 2. The output driver circuits 24 isolate the other logic circuitry inside the gated shift register 10 from the external circuitry being driven by the gated shift register 10 in the event that the external circuitry should create a current path to ground. The output driver circuits 24 also have the advantage that when the power is reapplied on the VCCI line, the outputs of these driver circuits will provide an unglitched logic 1 level or logic 0 level without any false logic levels which might be present when other forms of nonvolatile storage devices, such as EEPROMs, are powered up.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein. For example, the gated shift register of the present invention can also be used as a shift register in applications other than replacing mechanical dip switches or jumper wires.

What is claimed is:

1. An apparatus for receiving a serial data stream at an input terminal and for converting said serial data stream to a plurality of output signals appearing simultaneously at a like plurality of output terminals, comprising:
  (a) a first set of N storage devices;
  (b) input coupling means for coupling said input terminal to a first storage device of said first set of N storage devices;
  (c) interstage coupling means for transferring the data stored in the first N-1 storage devices of said first set of N storage devices to the last N-1 storage devices of said first set of N storage devices, to thereby form a shift register of N bits in length;
  (d) a second set of N storage devices, each having an output coupled to one of said output terminals; and
  (e) means for transferring the data stored in each of at least said first N-1 storage devices of said first set of N storage devices to a corresponding storage device in said second set of N storage devices in response to the presence of a first logic state applied to a transfer input terminal of said apparatus, wherein said transferring means isolates the data stored in at least said first N-1 storage devices of said first set of N storage devices from respective corresponding ones of said second set of N storage devices in response to a second logic state applied to said transfer input terminal, and wherein said last storage device of said second set of N storage devices is connected to always provide the data state of said last storage device of said first set of N storage devices.

2. Apparatus as set forth in claim 1 further including a primary power input terminal and a battery input terminal and further including means for powering said apparatus from a primary power voltage present at said primary power input terminal if said primary power voltage is greater than a first predetermined voltage, and for powering said apparatus from said battery voltage if said primary power voltage is less than said first predetermined voltage.

3. Apparatus as set forth in claim 2 wherein said input coupling means and said interstage coupling means further includes means for coupling the output of each of said N storage devices to the input of the same device of said first set of N storage devices; and said apparatus further includes means for detecting if said primary voltage is less than a second predetermined voltage that is greater than said first predetermined voltage, and for causing said input coupling means and said interstage coupling means to couple said output of each of said N storage devices to said input of said same device when said primary voltage is less than said second predetermined voltage.

4. Apparatus as set forth in claim 2 wherein said first set of said N storage devices includes means for transferring data into each of said first set of N storage devices in response to a clock signal received at a clock input terminal of said apparatus, and said apparatus further includes means for isolating said clock signal from said first set of N storage devices if said primary power voltage is less than said first predetermined voltage.

5. Apparatus as set forth in claim 2 wherein said output terminals are driven by a like plurality of driver circuits wherein said plurality of driver circuits are powered only by said primary power voltage.

6. Apparatus as set forth in claim 1 wherein said input coupling means and said interstage coupling means further includes means for coupling the output of each of said N storage devices to the input of the same device of said first set of N storage devices when said transfer input terminal is at said second logic state.

7. Apparatus as set forth in claim 1 further including means for resetting said first and second sets of N storage devices upon receipt of a reset signal at a reset input terminal.

8. A gated shift register, for receiving a serial data stream at an input terminal and for converting said serial data stream to a plurality of output signals appearing simultaneously at a like plurality of output terminals, comprising:
  (a) a first set of N storage devices;
  (b) input coupling means for coupling said input terminal to a first storage device of said first set of N storage devices, and for coupling the output of said first storage device to the input of said first storage device;
  (c) interstage coupling means for transferring the data stored in each of the first N-1 storage devices of said first set of N storage devices to the last N-1 storage devices of said first set of N storage devices, to thereby form a shift register of N bits in length, and for coupling the output of each of said last N-1 storage devices to the input of the same device of said last N-1 storage devices;

(d) a second set of N storage devices, each having an output coupled to one of said output terminals;

(e) means for transferring the data stored in each of at least said first N-1 storage devices of said first set of N storage devices to a corresponding storage device in said second set of N storage devices in response to the presence of a first logic state applied to a transfer input terminal of said apparatus, and wherein said transferring means isolates the data stored in at least said first N-1 storage devices of said first set of N storage devices from respective corresponding ones of said second set of N storage devices in response to a second logic state applied to said transfer input terminal, wherein said last storage device of said second set of N storage devices is connected to always provide the data state of said last storage device of said first set of N storage devices:

(f) means for powering said apparatus from the voltage present at a primary power input terminal if a primary power voltage at said primary power input terminal is greater than a battery voltage appearing at a battery input terminal, and for powering said apparatus from said battery voltage if said battery voltage is greater than said primary power voltage; and (g) means for detecting if said primary voltage is less than a predetermined voltage that is greater than said battery voltage, and for causing said input coupling means and said interstage coupling means to couple said output of each of said N storage devices to said input of said same device when said primary voltage is less than said predetermined voltage; and for causing said input coupling means to couple said input terminal to said first storage device of said first set of N storage devices and said interstage coupling means to transfer the data stored in each of said first N-1 storage devices of said first set of N storage devices to said last N-1 storage devices of said first set of N storage devices, to thereby form a shift register of N bits in length, when said primary power voltage is greater than said predetermined voltage.

9. A gated shift register as set forth in claim 8 wherein said output terminals are driven by a like plurality of driver circuit wherein said plurality of driver circuits are powered only by said primary power voltage.

10. A gated shift register as set forth in claim 8 further including means for resetting said first and second sets of N storage devices upon receipt of a reset signal at a reset input terminal.

* * * * *